(12) United States Patent
Lindahl

(10) Patent No.: US 9,097,743 B2
(45) Date of Patent: Aug. 4, 2015

(54) METHOD FOR ASSESSING THE RIPPLE OF A SIGNAL

(75) Inventor: Andres Murube Lindahl, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 420 days.

(21) Appl. No.: 13/559,841

(22) Filed: Jul. 27, 2012

(65) Prior Publication Data

US 2013/0085697 A1    Apr. 4, 2013

(30) Foreign Application Priority Data

Aug. 2, 2011    (DE) .......................... 10 2011 080 273

(51) Int. Cl.
| | |
|---|---|
| G01R 19/00 | (2006.01) |
| G01R 19/165 | (2006.01) |
| G06F 15/00 | (2006.01) |
| G06F 11/00 | (2006.01) |
| G01R 19/17 | (2006.01) |
| G01R 29/26 | (2006.01) |

(52) U.S. Cl.
CPC .......... *G01R 19/16528* (2013.01); *G06F 15/00* (2013.01); *G01R 19/17* (2013.01); *G01R 29/26* (2013.01)

(58) Field of Classification Search
CPC ................................................ G01R 19/16528
USPC ....................................................... 702/64–67
See application file for complete search history.

(56) References Cited

U.S. PATENT DOCUMENTS

| | | | |
|---|---|---|---|
| 2002/0033691 A1* | 3/2002 | Rolfes ........................... | 320/134 |
| 2006/0031035 A1* | 2/2006 | Brott et al. .................... | 702/108 |

* cited by examiner

*Primary Examiner* — Phuong Huynh
(74) *Attorney, Agent, or Firm* — Kenyon & Kenyon LLP

(57) ABSTRACT

A method for assessing a ripple of a signal, includes: a) determining a first signal value at a determination point in time, b) determining a signal value difference between the first signal value and a signal value determined at a previous determination point in time, c) incrementing an undershoot counter if the signal value difference falls below a first difference threshold value, and incrementing an overshoot counter and resetting the undershoot counter if the signal value difference exceeds a second difference threshold value, and d) determining that no ripple overshoot is present and resetting the overshoot counter if the undershoot counter overshoots an undershoot threshold value, and determining that a ripple overshoot is present if the overshoot counter exceeds an overshoot threshold value and the undershoot counter does not exceed an undershoot threshold value.

9 Claims, 3 Drawing Sheets

METHOD FOR ASSESSING THE RIPPLE OF A SIGNAL

BACKGROUND OF THE INVENTION

1. Field of the Invention

The present invention relates to a method for assessing a ripple of a signal, which may be used in particular during operation of an internal combustion engine.

2. Description of the Related Art

For reasons of operational safety and product reliability and due to legal requirements, electronic and/or electromechanical components of more complex structures include one or more diagnostic systems. With the aid of such systems, it is possible to establish errors, ascertain the type and origin of established errors, and prompt the particular component or a higher-order unit to reduce or eliminate effects of the errors on the component or on an entire system. A suitable emergency function may be activated for this purpose, for example. If an error occurs, it may also be stored as an error entry in an error memory, in order to be able to take targeted measures in a service workshop.

In onboard systems of motor vehicles, corresponding onboard diagnostic systems (OBD) monitor a majority of the electronic and/or electromechanical components. Depending on the type of the particular studied error, a diagnosis may be carried out by the onboard diagnostic system continuously or only under certain conditions. For example, a check for electrical errors, e.g., short circuits or load drops, is typically performed continuously.

Under certain circumstances, so-called false-positive errors may also occur in this case. Thus, it is known that voltage ripples in a supply signal which powers a corresponding diagnostic device or the device to be diagnosed, for example, a voltage signal of a generator or a motor vehicle battery, may impair a corresponding error recognition function. Incorrect entries in an error memory thus occur, for example, which do not originate from an actual error.

Therefore, there is a demand for a more reliable execution of error diagnostic functions, in particular in onboard diagnostic systems. In particular, there is a demand for a capability of recognizing an outsized ripple in a signal.

BRIEF SUMMARY OF THE INVENTION

According to the present invention, an additional test condition is provided for carrying out a diagnostic function, which is particularly advantageous for the diagnosis of signals which have a correlation to a battery voltage. As explained in greater detail hereafter, such a signal is a current flowing through an injector in particular, which influences an opening time of a fuel injector or a velocity of a rail pressure pump. In motor vehicles, essentially all currents and voltages to be monitored may be considered to be such signals which are correlated with the battery voltage or the vehicle electrical system voltage.

Electronic components typically have a specified operating voltage range, in which full functionality of the underlying hardware is ensured. Some of the associated diagnostic functions may, however, be limited by ripples in the battery voltage, as noted. If excessive voltage ripples exist, which exceed a specified maximum, the diagnosis may be suppressed for this case using the method as proposed according to the present invention. Corresponding voltage ripples do not in turn have to be attributed to errors, since they may also occur in normal operation due to consumers which are periodically connected or disconnected, for example, heating devices. If the voltages lie within the specified operating voltage range of the particular component, they may be used to activate the component without the component being damaged.

Through the concept according to the present invention, false-positive error entries and/or so-called "ghost errors" may therefore be suppressed, which significantly increases the robustness of a diagnostic function.

The method according to the present invention allows very simple signal analysis with only little use of resources. To carry out the method, one device is sufficient, which only has —possibly already partially present—determination means for determining signal values and signal value differences and has analysis means, which are configured to establish a ripple based on overshoot counters and undershoot counters, which are incremented in accordance with the signal value differences. A complex storage of a signal curve and/or an analysis by statistical and/or mathematical methods is not necessary. The method may therefore be implemented very easily and with minimal hardware equipment. This is advantageous in particular for control units in motor vehicles, which typically do not have extensive resources.

The method according to the present invention may also be retrofitted in existing systems, for example, in the form of a functionality update. As mentioned, the assessment method according to the present invention is suitable in particular for those devices whose diagnostic functions are at least partially a function of a voltage ripple.

A computer unit, e.g., a control unit of a motor vehicle and/or an onboard diagnostic system, is configured for the purpose, in particular by programming, of carrying out a method according to the present invention.

The implementation of the method in the form of software is also advantageous, since this causes particularly low costs, in particular if an executing control unit is still used for further tasks and is therefore present in any case. Suitable data carriers for providing the computer program are in particular diskettes, hard drives, flash memories, EEPROMs, CD-ROMs, DVDs, etc. A download of a program via computer networks (Internet, intranet, etc.) is also possible.

Further advantages and embodiments of the present invention result from the description and the appended drawings.

It is understood that the above-mentioned features and features still to be explained hereafter are usable not only in the particular specified combination, but rather also in other combinations or alone, without departing from the scope of the present invention.

The present invention is schematically illustrated on the basis of an exemplary embodiment/of exemplary embodiments in the drawings and is described in greater detail hereafter with reference to the drawings.

DETAILED DESCRIPTION OF THE INVENTION

Figure 1:
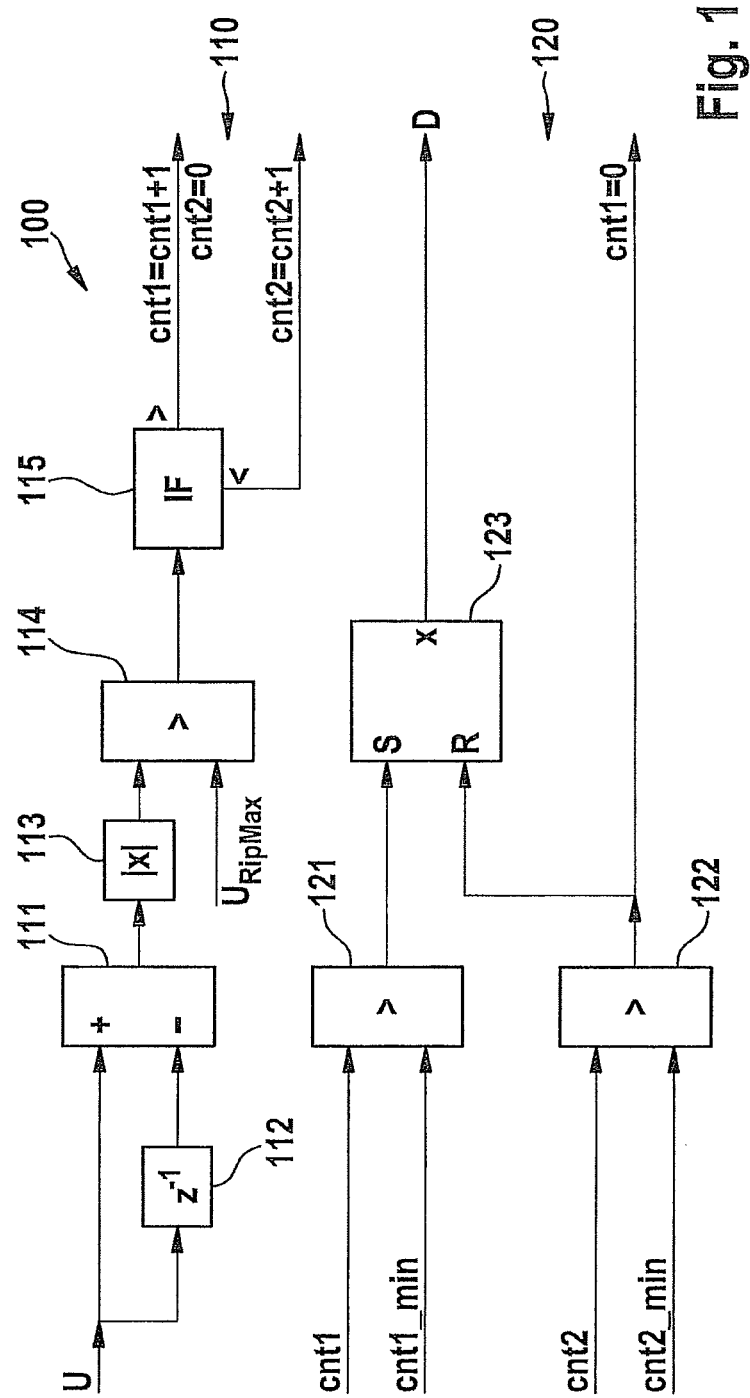
FIG. 1 shows a method according to a particularly preferred specific embodiment of the present invention in a schematic view.

In FIG. 1, a method according to a particularly preferred specific embodiment of the invention is schematically shown using function blocks and is identified as a whole by reference numeral 100.

The method according to the present invention includes two function blocks 110, 120. In a first function block 110, a signal value of a voltage signal U is digitized, analyzed, and converted into counter values. In a second function block 120, the particular counter values are compared to threshold values.

The method preferably operates in sampling cycles, which are separated by sampling intervals. In each sampling cycle, a signal value of signal U is determined and supplied to both a differentiator 111 and also a buffer memory 112. In each sampling cycle, the signal value of signal U buffered in buffer memory 112 is also supplied to differentiator 111. Differentiator 111 therefore receives signal values of the signal which were determined at a first determination point in time and a second (previous) determination point in time. In differentiator 111, the signal value determined at the first determination point in time is subtracted from the signal value determined at the second determination point in time, or vice versa, and therefore a differential value between the signal values is ascertained.

The sampling intervals are preferably ascertained with the aid of an interval optimization function and are adaptable to the particular diagnosis and/or operating function, to the ripple frequency to be expected, and/or to a possible voltage frequency. The ripple frequency to be expected may be ascertained based on a clocking of a consumer, for example, employing a hysteresis function of a heater.

In a function block 113, an absolute value |x| of the differential value ascertained in differentiator 111 is formed. The absolute value formed in function block 113 is supplied to a comparator 114. Comparator 114 carries out a comparison between absolute value |x| of the differential value and a difference threshold value $U_{RipMax}$. As a function of the result of the comparison, as stipulated by a decision block 115, either an incrementation of an overshoot counter cnt1 or a reset of an undershoot counter cnt2 is caused, if the differential value and/or its absolute value |x| exceed(s) difference threshold value $U_{RipMax}$, or an incrementation of undershoot counter cnt2 is caused, if the corresponding value falls below difference threshold value $U_{RipMax}$.

Although a preferred specific embodiment is shown in FIG. 1, in which a single difference threshold value $U_{RipMax}$ is used, two different difference threshold values $U_{RipMax}$ may be used for the different consequences (incrementing of cnt1 and resetting of cnt2, on the one hand, and incrementing of cnt2, on the other hand). The method thus becomes more complex, but may be adapted better or more flexibly to different conditions.

Those skilled in the art will advantageously design corresponding counters in such a way that a counter overflow, due to which an excessively small counter value will possibly be specified, is prevented or processed in a suitable way. For this purpose, for example, a sufficiently large range for possible counter contents may be predefined upon reaching a maximum counter value, a corresponding counter may be stopped thereon and not incremented further, or a counter overflow indicator may be defined.

The method operates on the basis of signal value differences. Although the formation of a differential value and the formation of an absolute value of the differential value were described above, in other embodiments, a corresponding differential value may also be used directly as the signal value difference. For example, a smaller signal value may always be subtracted from a larger signal value in a differentiator, so that positive values are always obtained, or a differential value may be compared to positive and negative difference threshold values $U_{RipMax}$ or $-U_{RipMax}$.

As already previously mentioned, overshoot counter and undershoot counter cnt1, cnt2 are analyzed in function block 120. Overshoot counter and undershoot counter cnt1, cnt2 are each supplied to a comparator 121, 122. In comparators 121, 122, in each case overshoot counter cnt1 is compared to an overshoot threshold value cnt1_min and undershoot counter cnt2 is compared to an undershoot threshold value cnt2_min.

If overshoot counter cnt1 exceeds overshoot threshold value cnt1_min, which means that a predefined number of voltage ripple events has occurred, and if undershoot counter cnt2 does not fall below undershoot threshold value cnt2_min, a suppression signal D is output using an analysis block 123, which suppresses a corresponding diagnostic function and/or an operating function execution. In contrast, if a predetermined number of undershoot events is detected, which is expressed by exceeding undershoot threshold value cnt2_min by undershoot counter cnt2 and is determined in comparator 122, a reset of overshoot counter cnt1 and corresponding signaling to function block 123 take place, whereby a suppression signal is not output.

Figure 2:
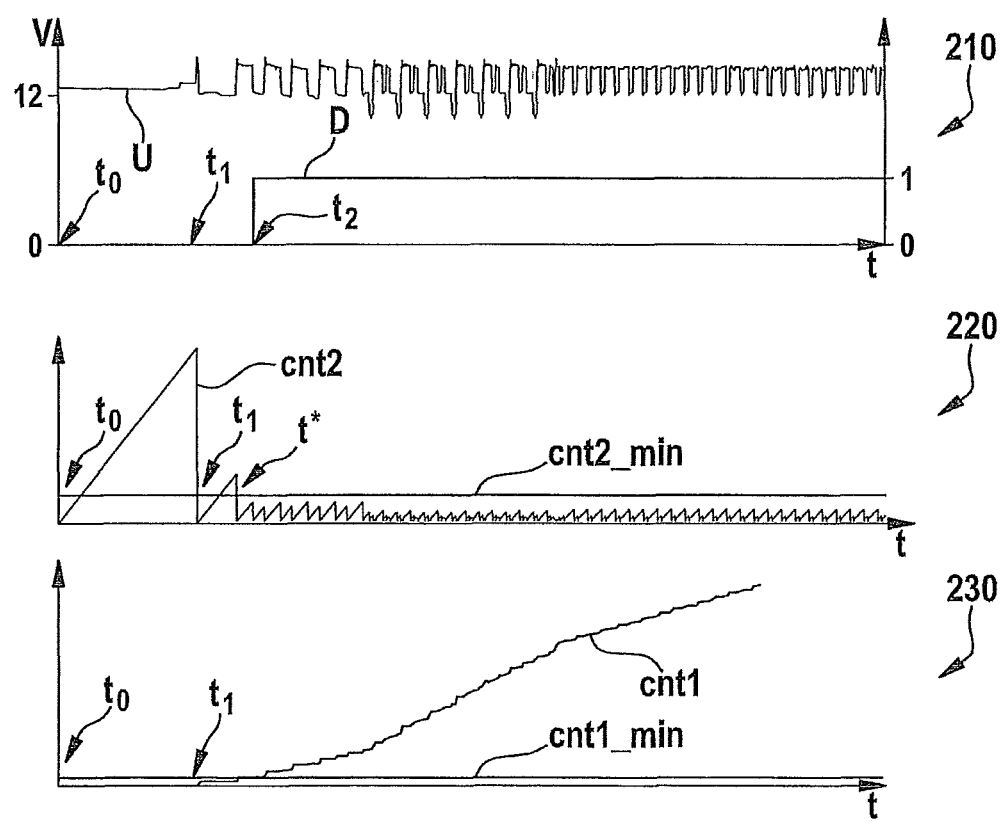
FIG. 2 shows signals, counters, and threshold values according to a particularly preferred specific embodiment of the present invention.

In FIG. 2, signals, counters, and threshold values are each shown according to a particularly preferred specific embodiment of the present invention in the form of graphs 210, 220, and 230.

In graph 210, a voltage signal U in volts (left ordinate) and a suppression signal D in dimensionless units (right ordinate) are plotted against a time t. Voltage signal U corresponds to a battery voltage signal, which has a significant ripple from a point in time $t_1$. Illustrated voltage signal U in the present example of FIG. 1 represents a battery voltage signal of a vehicle electrical system of a motor vehicle, which has a corresponding ripple due to a (clocked) activation of a heating device. The maximum voltage drop is approximately 0.8 Vpp at a frequency of less than 0.2 Hz. From a point in time $t_2$, on the basis of an assessment of a signal ripple, suppression signal D is output, which remains in existence during the entire period of time of the signal ripple.

The conditions for providing suppression signal D are illustrated hereafter on the basis of graphs 220 and 230.

In graph 220, an undershoot signal cnt2 and an undershoot threshold value cnt2_min in the form of dimensionless units are plotted against a time t. The time scale corresponds to that of graph 210. In a period of time between a time point $t_0$ and a time point $t_1$, in which the voltage signal, as is apparent from graph 210, has no or only a slight ripple, undershoot counter cnt2 is continuously incremented and exceeds undershoot threshold value cnt2_min in broad ranges of the period of time. At point in time $t_1$, a ripple event occurs for the first time, as is apparent from graph 210 with respect to voltage signal U, which may be detected by determining the signal value difference between a signal value at a previous point in time and a signal value of signal U at an instantaneous point in time. Undershoot counter cnt2 is reset to zero thereby. Between points in time $t_1$ and $t_2$, after a singular ripple event at point in time $t_1$, initially no further noticeable signal ripple may be determined, so that undershoot counter cnt2 once again exceeds the undershoot threshold value. However, from point in time t* at the latest, an increased ripple occurs up to the end of the period of time shown, so that undershoot counter cnt2 is always reset to zero before reaching undershoot threshold value cnt2_min.

The effects on overshoot counter cnt1 in comparison to overshoot threshold value cnt1_min are illustrated in graph 230. As previously explained, overshoot counter cnt1 is only reset if undershoot counter cnt2 exceeds undershoot threshold value cnt2_min. Since this is no longer the case from point in time t*, overshoot counter cnt1 is continuously incremented and exceeds overshoot threshold value cnt1_min at point in time t2. The suppression signal is output at point in time t2 due to this exceedance.

Figure 3:
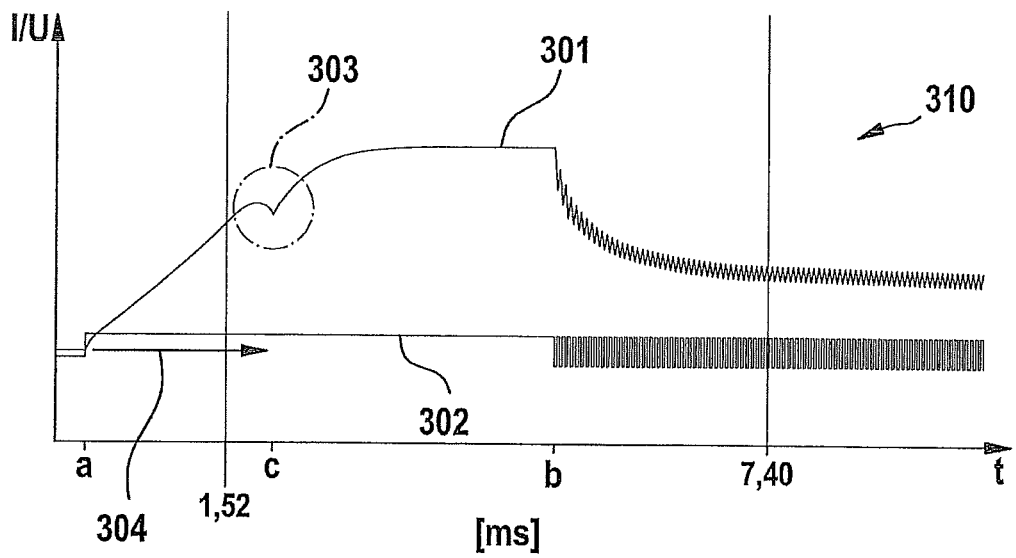
FIG. 3 shows activation signals of a fuel injector.
Figure 3:
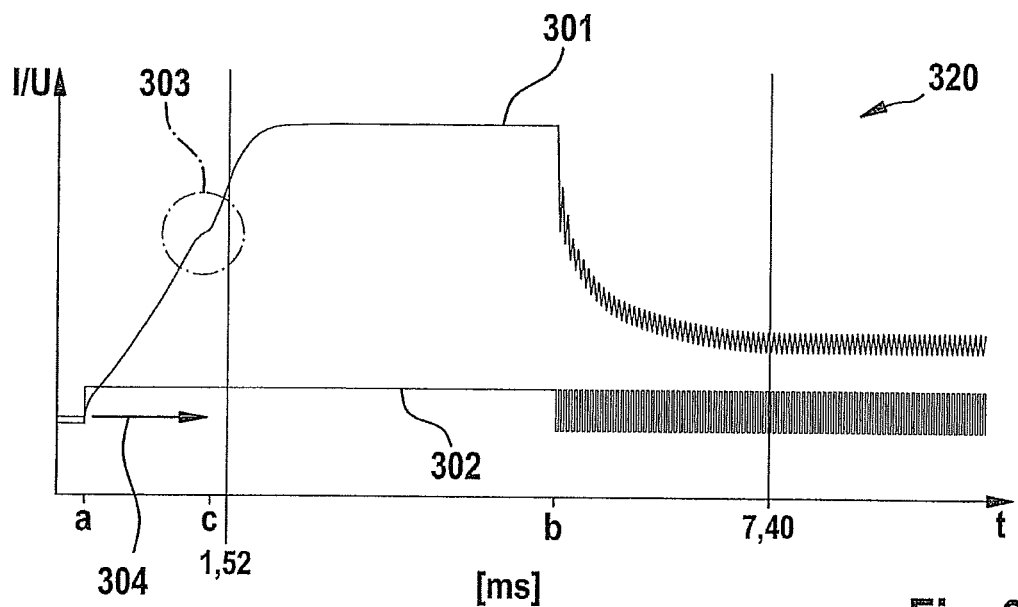

In FIG. 3, typical activation currents, which are known per se, for a solenoid valve of an internal combustion engine are illustrated upon use of a voltage of 10 V in graph 310 and a voltage of 14 V in graph 320. Graph 310 and 320 each indicate current curves 301 (in amperes) and voltage signals 302 (in volts) in relation to a time t (in milliseconds).

Current curves 301 are each generated by applying particular voltage signals 302 to a valve coil of the metering valve. Up to a point in time a, no voltage signal 302 is applied. Between point in time a and a point in time b, the valve coil is continuously energized using the particular voltage of 10 V or 14 V. Between point in time b and the end of the illustrated signal, a clocked voltage application takes place, e.g., by pulse-width modulation (PWM).

Due to a characteristic kink 303 in current curves 301, a valve opening point in time c (beginning of the injection point, BIP) or a valve opening time 304 may be inferred. At valve opening point in time c, as is also known per se, the valve armature of a corresponding valve strikes against its valve seat. Due to the rapid speed change of the valve armature, inductive effects occur in the valve coil (induction of a countercurrent), which in turn cause corresponding kink 303.

Valve opening point in time c, as is apparent from a comparison between graphs 310 and 320, is directly dependent on the value of the particular applied voltage during the continuous energizing between points in time a and b. At a voltage of 10 V (graph 310), kink 303, and therefore valve opening point in time c, may be observed significantly after the point in time of 1.52 ms shown as an example; at a voltage of 14 V (graph 320), it may be observed significantly before this point in time.

Kink 303 in a current curve 301 may, as is known from the related art, be used for a function check of a corresponding valve. For this purpose, current curve 301 is sampled within a time window in which kink 303 is expected. If no kink 303 is determined within the time window, it may be presumed that the valve armature has not moved and blocks a corresponding valve (continuously open, blocked open, or blocked closed), i.e., is faulty.

Voltage ripples cause temporarily higher and/or temporarily lower voltages (voltage peaks or voltage drops). If a voltage drop occurs between points in time a and b, the corresponding valve possibly switches more slowly than expected. Kink 303 in associated current curve 301 is therefore possibly no longer detected within the particular sampling window. It is therefore incorrectly presumed that the valve has not switched, and a false-positive error entry is generated. This is correspondingly true for voltage peaks occurring between points in time a and b. These cause a valve to switch more rapidly than expected. Kink 303 may therefore lie before the corresponding sampling window. The beginning of the sampling window is typically also defined in the form of an estimated value by particular previous opening point in time c. If voltage ripples are present, which modify opening point in time c of the fuel injector as described above, a corresponding determination function therefore incorrectly estimates the position of the determination window for the next injection.

In the mentioned cases, the plausibility check according to the present invention may be used. If it is determined that a voltage ripple is present or was present during a corresponding activation phase, opening point in time c ascertained during this period of time (or not ascertained due to the above-described shift) is not taken into account. An error entry is thus not generated and/or affected opening point in time c is not taken into account in the definition of the sampling window used in the particular next cycle. In this case, e.g., stored previous values and/or standard specifications are used.

The presented method may therefore be used, e.g., in a diagnostic function of a diesel exhaust fluid (DEF) metering valve.

What is claimed is:

1. A method for assessing a ripple of an electrical signal of one of an electronic or electromechanical component of a device, comprising:
    obtaining the signal at first and second points in time, by processing circuitry, at a signal input of the processing circuitry, and from a sampling device;
    determining, by the processing circuitry, a first signal value of the signal at the first point in time, a second signal value of the signal at the second point in time, and a difference between the first and second signal values, wherein the second point in time is prior to the first point in time;
    performing, by the processing circuitry, a counter modification according to a configuration that causes the processing circuitry to:
        increment an undershoot counter if the difference is below a first difference threshold value; and
        increment an overshoot counter and reset the undershoot counter if the difference exceeds a second difference threshold value; and
    executing, by the processor circuitry, a counter response according to a configuration that causes the processing circuitry to:
        determine that no ripple overshoot is present and reset the overshoot counter if the undershoot counter exceeds an undershoot threshold value; and
        determine that a ripple overshoot is present if the overshoot counter exceeds an overshoot threshold value and the undershoot counter does not exceed the undershoot threshold value.

2. The method as recited in claim 1, wherein the signal is a voltage signal and the first and second signal values are voltage values of the voltage signal.

3. The method as recited in claim 2, wherein the voltage signal is a motor vehicle electrical system voltage signal provided by one of a battery or a generator.

4. The method as recited in claim 3, wherein the first and second determination points in time are separated by a predetermined sampling interval.

5. The method as recited in claim 1, further comprising:
    outputting a suppression signal if a ripple overshoot is present.

6. The method as recited in claim 1, wherein the first and second difference threshold values have the same value.

7. The method as recited in claim 1, wherein a diagnostic function or an operating function of a device to which the signal is applied is (i) only executed if no ripple overshoot with respect to the signal is present, or (ii) at least temporarily suppressed if a ripple overshoot with respect to the signal is present.

8. The method as recited in claim 3, wherein:
    the method is used during operation of a solenoid valve of an internal combustion engine, the voltage signal being applied to the solenoid valve;
    a switching point in time of the solenoid valve is determined based on a current through a valve armature of the solenoid valve; and a plausibility check is performed based on the assessment of the ripple of the voltage signal.

9. A non-transitory computer-readable data storage medium storing a computer program having program codes which, when executed on a computer, perform a method for assessing a ripple of a signal associated with one of an electronic or electromechanical component of a device, the method comprising:
   a) determining a first signal value of the signal at a first determination point in time;
   b) determining a signal value difference between the first signal value and a second signal value of the signal determined at a second determination point in time prior to the first determination point in time;
   c) performing a counter modification, the program codes including instructions by which, in the counter modification, the computer increments an undershoot counter if the signal value difference falls below a first difference threshold value, and increments an overshoot counter and resets the undershoot counter if the signal value difference exceeds a second difference threshold value; and
   d) performing a counter response, the program codes including instructions by which, in the counter response, the computer determines that no ripple overshoot is present and resets the overshoot counter if the undershoot counter exceeds an undershoot threshold value, and determines that a ripple overshoot is present if the overshoot counter exceeds an overshoot threshold value and the undershoot counter does not exceed the undershoot threshold value;

wherein:
   the signal is a motor vehicle electrical system voltage signal provided by one of a battery or a generator;
   the first and second signal values are voltage values of the voltage signal;
   the method is used during operation of a solenoid valve of an internal combustion engine;
   the voltage signal is applied to the solenoid valve;
   a switching point in time of the solenoid valve is determined based on a current through a valve armature of the solenoid valve; and
   a plausibility check is performed based on the assessment of the ripple of the voltage signal.

* * * * *